US012684722B2

(12) United States Patent
Bekaert

(10) Patent No.: US 12,684,722 B2
(45) Date of Patent: Jul. 14, 2026

(54) SEALED ELECTRONIC HOUSING

(71) Applicant: Continental Automotive Technologies GmbH, Hannover (DE)

(72) Inventor: Jean-Philippe Bekaert, Toulouse (FR)

(73) Assignee: CONTINENTAL AUTOMOTIVE TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 19/135,436

(22) PCT Filed: Dec. 22, 2023

(86) PCT No.: PCT/EP2023/087750
§ 371 (c)(1),
(2) Date: Jun. 4, 2025

(87) PCT Pub. No.: WO2024/156456
PCT Pub. Date: Aug. 2, 2024

(65) Prior Publication Data
US 2026/0013060 A1     Jan. 8, 2026

(30) Foreign Application Priority Data

Jan. 24, 2023    (FR) ...................................... 2300628

(51) Int. Cl.
*H05K 5/06* (2006.01)
*H01Q 1/42* (2006.01)
(Continued)

(52) U.S. Cl.
CPC ............... *H05K 5/061* (2013.01); *H01Q 1/42* (2013.01); *H05K 5/0034* (2013.01); *H05K 5/03* (2013.01)

(58) Field of Classification Search
CPC .......... H05K 5/061; H05K 5/069; H05K 5/10; H05K 5/15; H05K 5/034
See application file for complete search history.

(56) References Cited

U.S. PATENT DOCUMENTS

2013/0242481 A1* 9/2013 Kim ..................... H04M 1/0249
361/679.01
2017/0112003 A1* 4/2017 Garcia ................. H05K 5/0052
(Continued)

FOREIGN PATENT DOCUMENTS

EP        1633015 A1      3/2006
EP        3627980 A1      3/2020

OTHER PUBLICATIONS

Written Opinion on the Patentability of the Invention and Preliminary Research Report with machine translation mailed on Jul. 25, 2023 by the French Patent Office in corresponding French Patent Application No. FR2300628. (14 pages).
(Continued)

*Primary Examiner* — Anthony Q Edwards
(74) *Attorney, Agent, or Firm* — Buchanan Ingersoll & Rooney PC

(57)                ABSTRACT

A sealed electronic antenna box includes: a rigid chassis having a first opening at one of the edges of the chassis; a rigid cover having a second opening at one of the edges of the cover; an electronic board having an antenna region close to one edge of the electronic board. The board mounted in the box such that an upper face of the antenna region faces the first opening in the chassis and a lower face of the antenna region faces the second opening in the cover. A cap engages an edge of the electronic board to cover the antenna region and the first and second openings. A seal overmolded on an external surface of the cap, extends along the free edges of the cap. When the cover and chassis are mounted on the electronic board, the seal is compressed against a surface of the chassis and the cover.

10 Claims, 7 Drawing Sheets

(51) Int. Cl.
  *H05K 5/00* (2006.01)
  *H05K 5/03* (2006.01)

(56) References Cited

U.S. PATENT DOCUMENTS

2020/0093018 A1*  3/2020  Chou .................... H05K 5/061
2020/0221600 A1  7/2020  Chou et al.
2021/0359401 A1*  11/2021  Bae ......................... H01Q 1/22

OTHER PUBLICATIONS

International Search Report (PCT/ISA/210) and Written Opinion (PCT/ISA/237) with machine translation mailed on Apr. 23, 2024 by the European Patent Office as the International Searching Authority for International Application No. PCT/EP2023/087750. (18 pages).

* cited by examiner

[Fig. 1]
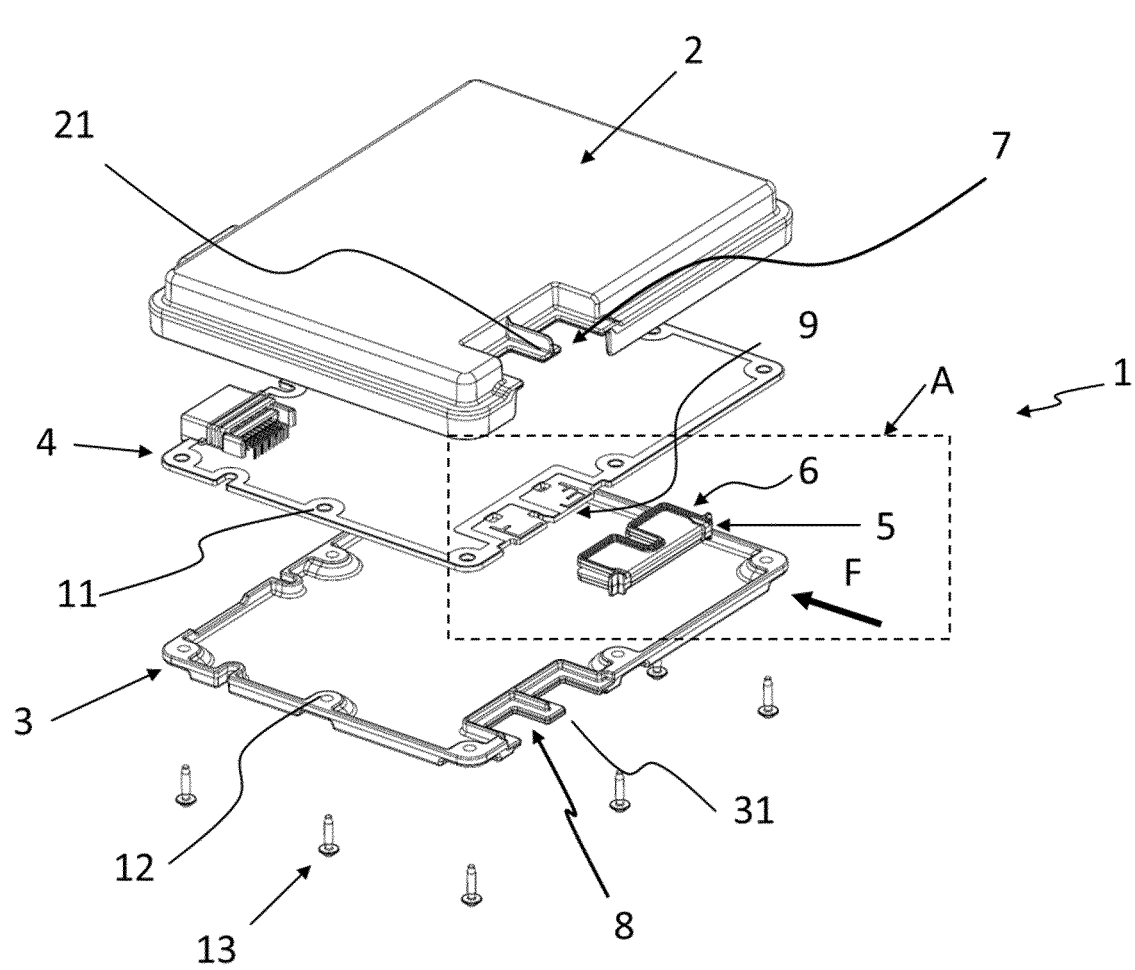

[Fig. 2A]
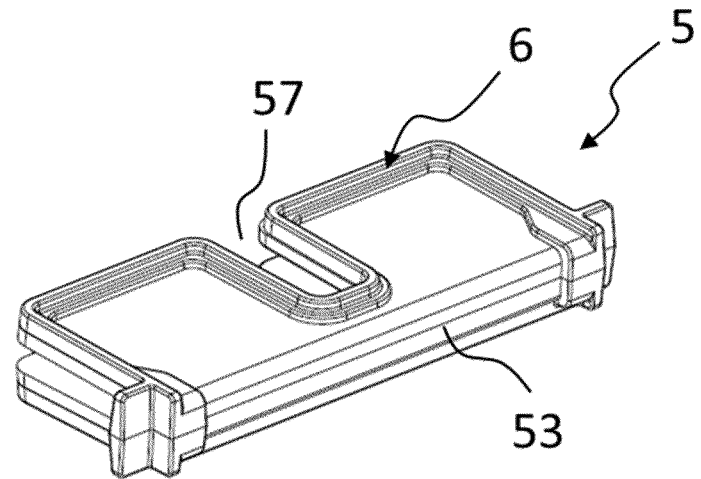
[Fig. 2B]
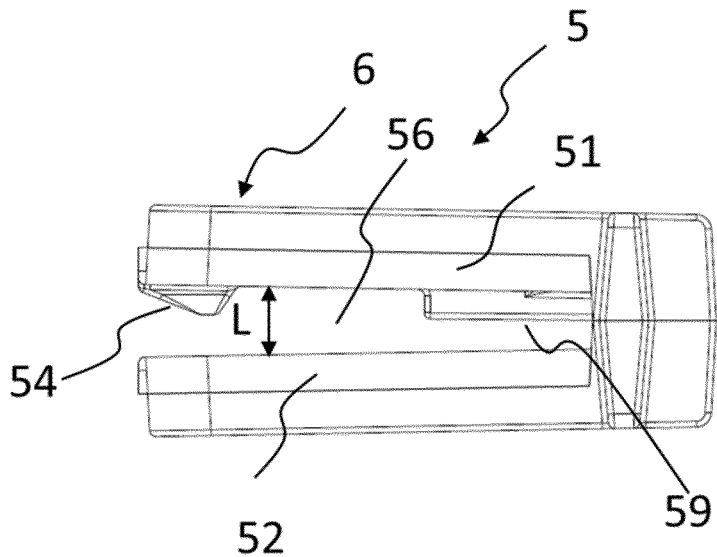

[Fig. 2C]
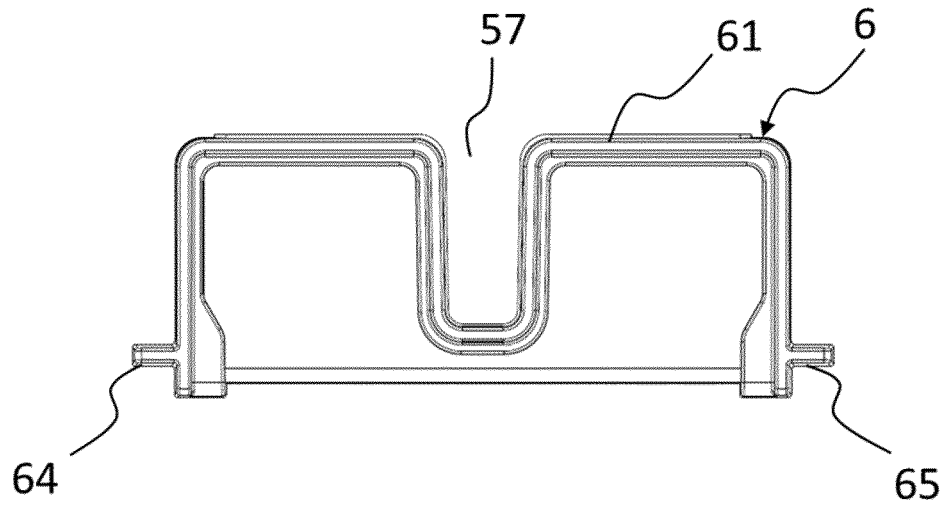
[Fig. 2D]
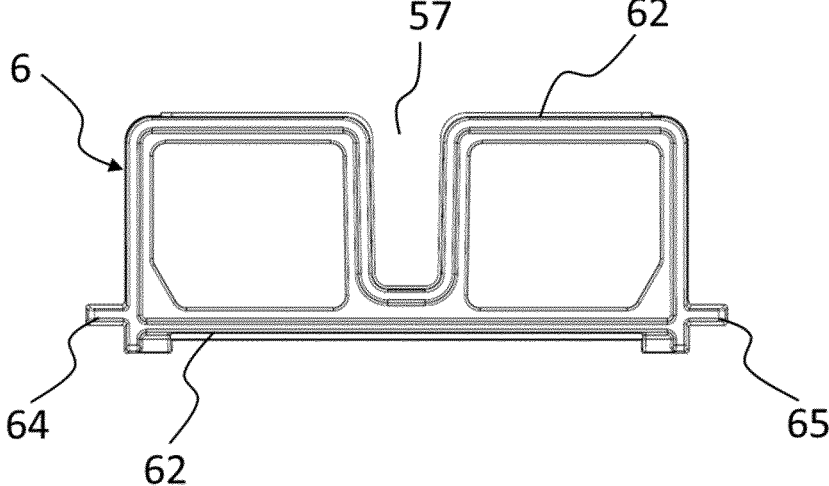

[Fig. 2E]
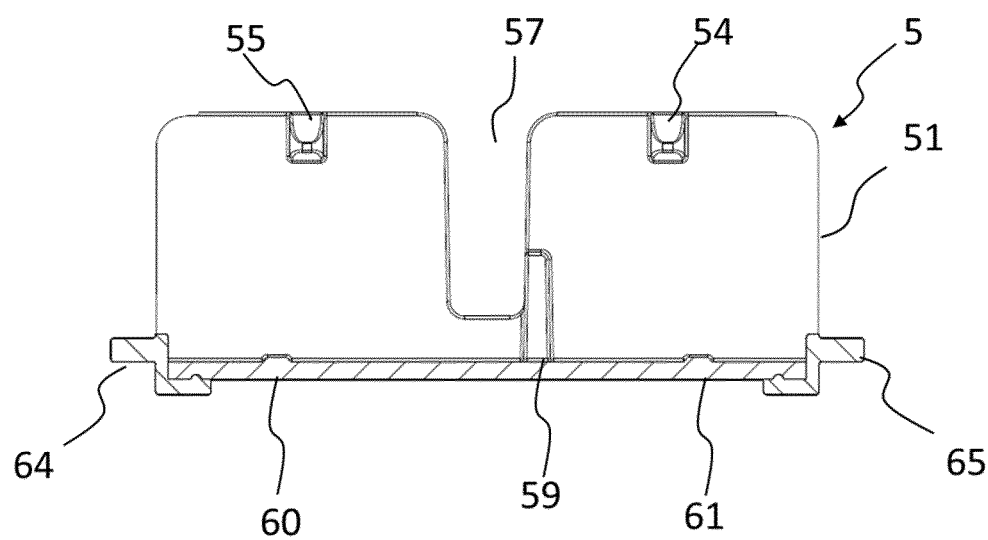

[Fig. 3]
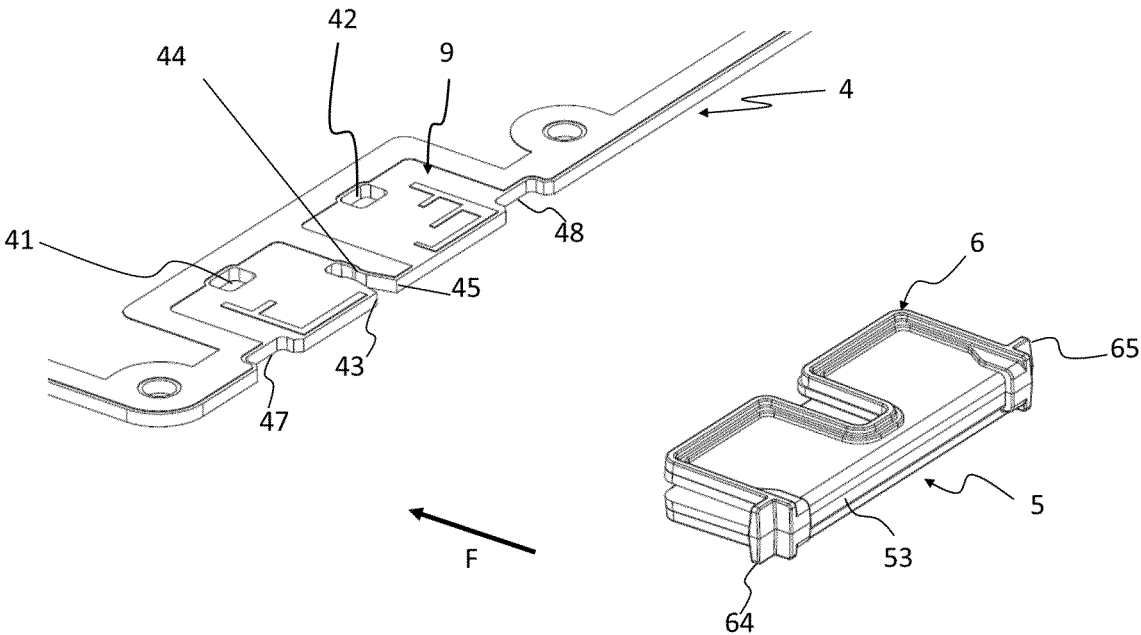
[Fig. 4]
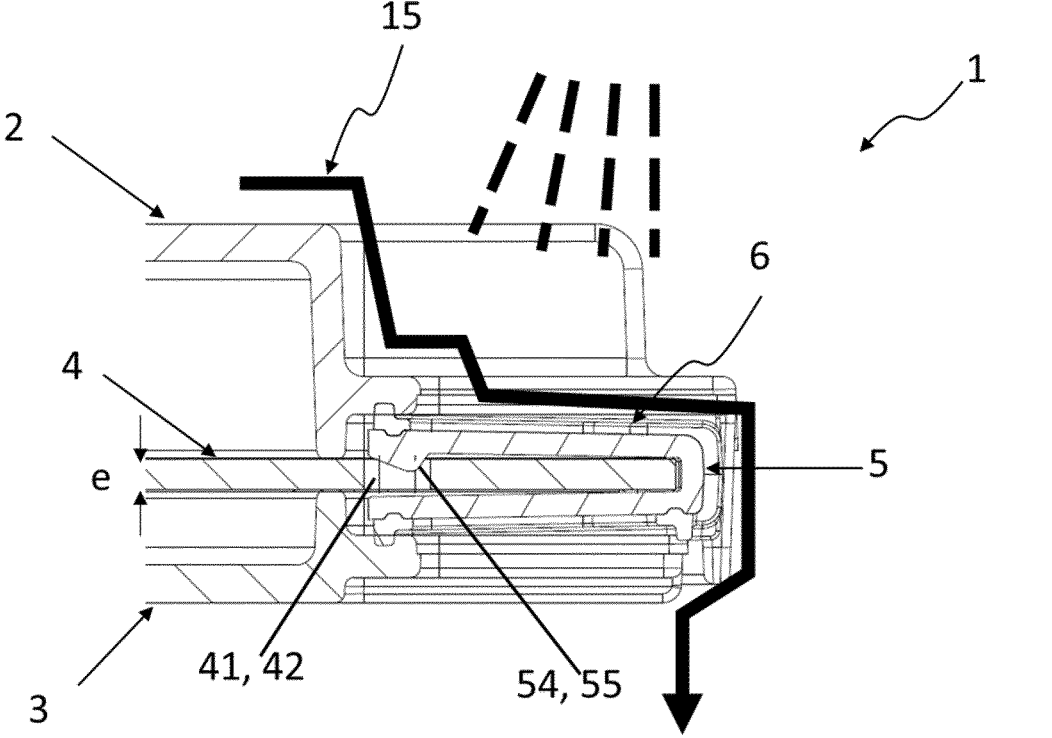

[Fig. 5A]
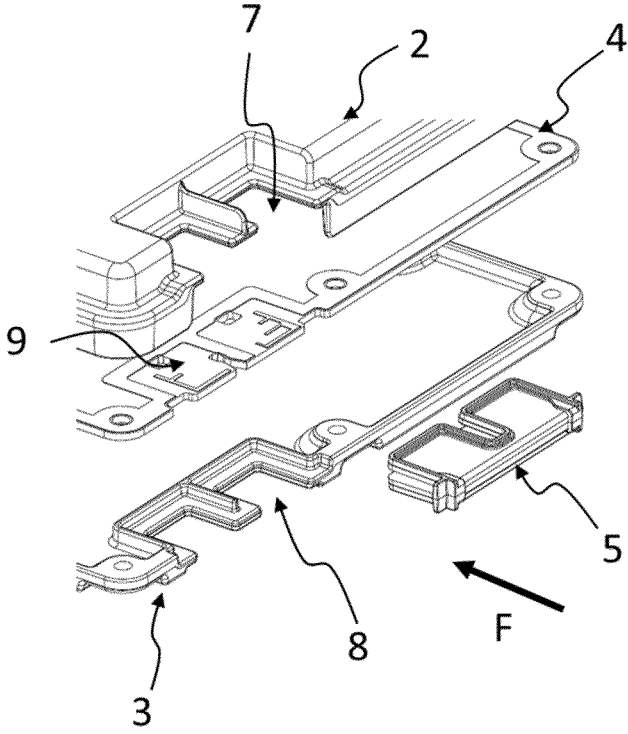
[Fig. 5B]
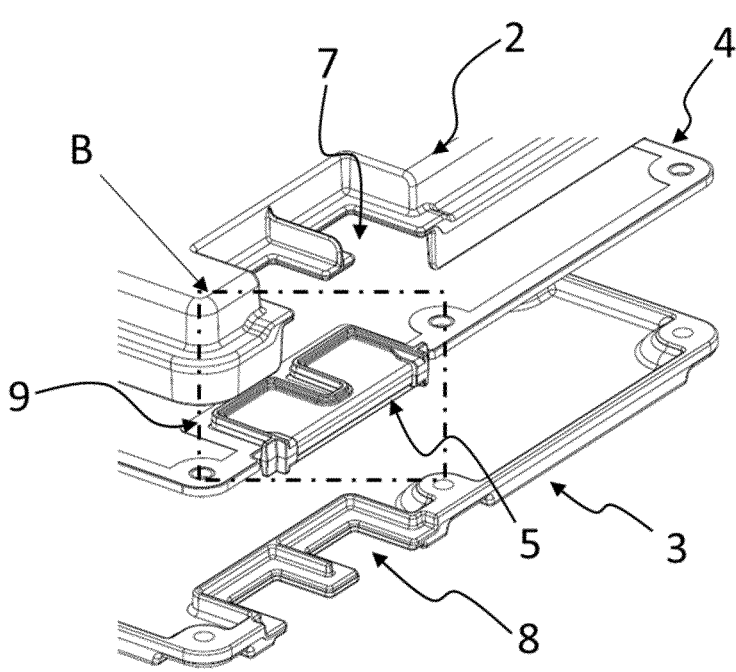

[Fig. 5C]
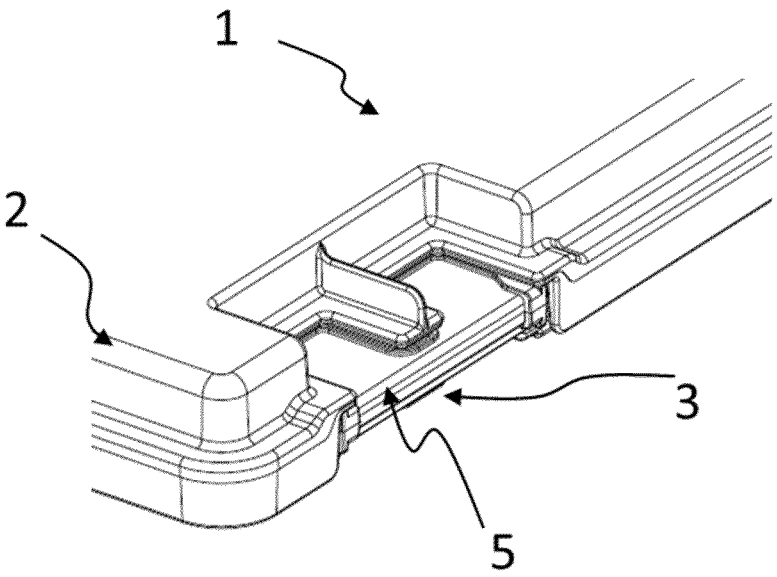
[Fig. 6]
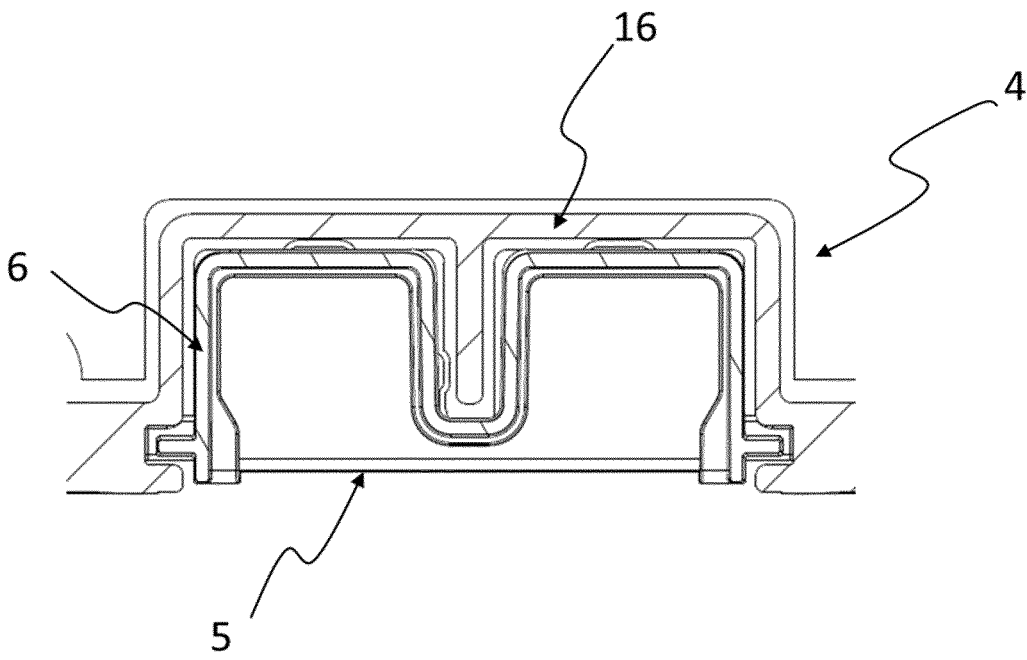

SEALED ELECTRONIC HOUSING

CROSS REFERENCE TO RELATED APPLICATIONS

This application is the U.S. National Phase Application of PCT International Application No. PCT/EP2023/087750, filed Dec. 22, 2023, which claims priority to French Patent Application No. FR2300628, filed Jan. 24, 2023, the contents of such applications being incorporated by reference herein.

FIELD OF THE INVENTION

The present disclosure lies in the field of electronic antenna boxes for transmitting and receiving signals, which can be used in applications implemented in an outside environment, in particular in the automotive sector.

BACKGROUND OF THE INVENTION

Electronic boxes with a printed circuit having antennas for remotely receiving and communicating information are known.

Such an electronic box generally comprises a chassis fastened to a cover, thereby forming a casing delimiting a housing space. A printed circuit board having the antenna region is received in the housing space. The antennas are routed close to an edge of the printed circuit board. The cover, the chassis and the printed circuit board are then fastened together so as to retain the board in the electronic box by means of fastening elements such as screws.

The casings used to be mainly made of plastics material, thereby allowing the antennas situated inside the casing to transmit and receive the signals through the casing. However, with the increase in the computing power and the heat dissipation required, the casings are now mainly made of metal and block the transmission and reception of the signals. A first solution consists in arranging the antennas entirely outside the casing so as to avoid the Faraday cage phenomenon. Another solution consists in providing an opening in the casing, thereby making it possible to place the antenna region in direct contact with the outside environment of the casing for the transmission and reception of the signals.

However, these solutions need to continue to ensure proper protection of the electronic elements arranged in the electronic box, and in particular to ensure that the assembly is sealed with regard to the penetration of a liquid or any other impurity. Furthermore, it is also desirable to limit production costs by limiting the number of assembly steps and storage costs by limiting the number of parts to be assembled.

Various solutions have been proposed in an attempt to address these issues relating to a lack of sealing.

In the configuration in which the antennas are away from the electronic board, i.e. the antenna region is no longer carried by the electronic board, the assembly therefore comprises two parts, a first part with the power electronics printed circuit board and a second part with the antenna region formed by a second board. The two parts are generally connected together by shielded cables. This solution entails a high production cost on account of the larger number of components required. Moreover, the assembly formed by the two parts requires more space than in the case of a single box, and entails a problem of integration. Moreover, the additional components entail an increase in the assembly time. Lastly, the problem of sealing is transferred to the connections between the two parts. Therefore, this solution is not satisfactory as regards optimizing the production cost and as regards sealing.

In order to overcome this drawback, the creation of an opening in the casing at the antenna region for the transmission and reception of the signals has been proposed. Thus, the box is no longer split into two parts and comprises a single board on which the antennas are routed. However, since the antenna region is exposed to the outside environment, it is necessary to implement a sealing solution to seal the electronic box assembly, this consisting in mounting a protective cap on the electronic board, covering the antenna region and the opening. A seal is then deposited at the interfaces between the border of the opening and the cap in order to seal the assembly. However, this solution is not entirely satisfactory since it does not allow the assembly to be disassembled, resulting in an increase in the scrap rate and making recyclability more complex.

There is therefore a need for a sealing solution that is compatible with all these issues.

SUMMARY OF THE INVENTION

An aspect of the present disclosure aims to overcome the drawbacks of the prior art.

An aspect of the present disclosure aims to provide a solution which is intended to ensure effective sealing while limiting the production costs and ensuring that the box can be disassembled, in a limited installation space so as not to have a negative effect on its integration into applications, in particular applications in the automotive sector.

To this end, a sealed electronic antenna box is provided, comprising:

a rigid chassis having a first opening positioned at one of the edges of the chassis;

a rigid cover having a second opening positioned at one of the edges of the cover;

an electronic board having an antenna region arranged close to one edge of the electronic board, the board being mounted in the box such that an upper face of the antenna region is oriented so as to face the first opening in the chassis and a lower face of the antenna region is oriented so as to face the second opening in the cover;

a cap configured to engage with an edge of the electronic board so as to cover the antenna region and the first and second openings;

a seal overmolded on an external surface of the cap, extending along the free edges of the cap such that when the cover and the chassis are mounted on the electronic board, the seal is compressed against a surface of the chassis and of the cover in order to close the two openings in a sealed manner.

According to one embodiment, the cap comprises an upper arm and a lower arm that are connected together by a transverse arm so as to form a U-shaped housing in which the antenna region is received, the upper arm covering a face of the antenna region that is oriented toward the chassis and the lower arm covering a face of the antenna region that is oriented toward the cover, and the transverse arm covering an edge face of the electronic board.

The features set out in the following paragraphs can be implemented optionally. They can be implemented independently of one another or in combination with one another:

the overmolded seal comprises a first seal strip which extends continuously along the free edge of the upper arm, and a second seal strip which extends continuously along the free edge of the lower arm and along the ridge between the lower arm and the transverse arm.

the cap comprises at least one protrusion formed on an internal face of the upper arm, and the electronic board comprises at least one associated hole which is intended to receive said at least one protrusion in order to retain the cap on the board.

the cap comprises a centering rib formed on an internal face of the upper arm, and the electronic board comprises an associated centering slot which is intended to receive the centering rib. The centering rib is not disposed in the plane of symmetry of the cap so as to provide an orienting poka-yoke while the cap is being positioned on the electronic board.

the cap comprises at least one stop element formed on an internal face of the upper arm, an edge of the electronic board bearing against the stop element when the cap is positioned on the electronic board.

the chassis comprises a first retaining tab positioned in the first opening and the cover comprises a second retaining tab positioned in the second opening, the retaining tabs extending parallel to the positioning direction (F) of the cap from an edge of the opening that is perpendicular to the positioning direction (F) of the cap, and the cap comprises an associated groove which is configured such that when the cover and the chassis are mounted on the electronic board, the first and second retaining tabs bear against a portion of the overmolded seal extending along the groove.

the cap is made of rigid plastics material and the seal is made of thermoplastic elastomer.

BRIEF DESCRIPTION OF THE DRAWINGS

Further features, details and advantages will become apparent from reading the detailed description below, and from analyzing the appended drawings, in which:

FIG. 1 schematically illustrates an exploded perspective view of a sealed electronic antenna box according to one embodiment;

FIG. 2A schematically illustrates a perspective view of the cap;

FIG. 2B schematically illustrates a profile view of the cap;

FIG. 2C schematically illustrates a top view of the cap;

FIG. 2D schematically illustrates a bottom view of the cap;

FIG. 2E schematically illustrates a view of an internal face of the cap;

FIG. 3 is an enlarged view of the zone A in FIG. 1;

FIG. 4 schematically illustrates a cross-sectional view of the sealed electronic antenna box in FIG. 1;

FIG. 5A schematically illustrates a step in the method for assembling the electronic box in FIG. 1, in which the cap is in a position for engaging with the electronic board;

FIG. 5B schematically illustrates a step in the method for assembling the electronic box in FIG. 1, in which the cap has been positioned on the electronic board, covering the antenna region;

FIG. 5C schematically illustrates a step in the method for assembling the electronic box in FIG. 1, in which the cover and the chassis have been fastened to the electronic board with the seal compressed against the cover and the chassis so as to close the opening in the cover and the opening in the chassis in a sealed manner;

FIG. 6 schematically illustrates a top view of an enlarged zone (B) in FIG. 5B, showing the cap mounted on the electronic board.

DESCRIPTION OF THE EMBODIMENTS

The drawings and the following description contain mostly elements of a certain nature. Consequently, they can be used not only to clarify the understanding of the present disclosure, but also to contribute to its definition if necessary.

Reference is now made to FIG. 1 which illustrates a sealed electronic box 1 according to one embodiment. The electronic box 1 has a rigid chassis 2, a rigid cover 3, an electronic board 4 on which antennas 9 are routed close to an edge of the electronic board, and a cap 5 provided with a seal 6.

The sealed electronic box 1 may be, for example, a radio receiver box located under the spoilers of a vehicle, or a telematic box and/or emergency call box which need to meet high sealing criteria in order to ensure the integrity of the electronic board.

The chassis 2 and the cover 3 are assembled together to form a box in which the electronic board 4 is mounted. The cover 3 is configured to be fastened to the chassis 2 and to the electronic board 4 so as to retain the electronic board in the box. Thus, the cover 3 and the electronic board 4 comprise a plurality of fastening holes 11, 12 that are intended to receive screws 13 for fastening the electronic board 4 and the cover 3 to the chassis 2.

It is apparent from FIG. 1 that the electronic board 4 is provided with an antenna region 9 for the transmission and reception of the signals. The antenna region is formed close to the edge of the electronic board.

The chassis 2 and the cover 3 are both rigid in order to ensure good integrity of the electronic board 4. The chassis 2 and the cover 3 are preferably made of a metal material in order to ensure the electromagnetic shielding of the electronic board and the heat dissipation of the components carried by the board. In order to allow the antennas to transmit and receive the signals through the metal walls of the box, the chassis 2 has a first opening 7 formed in an edge of the chassis and the cover 3 has a second opening 8 formed in an edge of the cover. The board 4 is mounted in the box such that an upper face of the antenna region 9 is oriented so as to face the first opening 7 in the chassis 2 and a lower face of the antenna region 9 is oriented so as to face the second opening 8 in the cover 3. Thus, the signals can be transmitted and received by the antennas.

In order to ensure that the electronic box is sealed, the electronic box 1 comprises a cap 5 configured to engage with an edge of the board in the thickness direction of the electronic board in order to cover the antenna region 9, the first opening 7 and the second opening 8. The cap 5, in contrast to the prior art, is provided with a seal 6 overmolded on an external surface of the cap, extending along the free edges of the cap such that when the cover 3 and the chassis 2 are mounted on the electronic board 4, the seal 6 is compressed against a surface of the chassis 2 and of the cover 3 in order to close the two openings 7, 8 in a sealed manner, as illustrated in FIG. 4. Thus, it is no longer necessary to deposit a seal before or after assembly. Moreover, directly overmolding the seal directly on the cap makes it possible to remove the cap if the electronic box fails, making it possible to replace the defective electronic board, for example, or any other electronic element. This reduces the manufacturing cost and the scrap rate. The removability of the cap also makes it possible to simplify the process of recycling the electronic antenna boxes.

The cap 5 is made from a suitable material for allowing the signals to pass through. Preferably, the cap 5 is made of rigid plastics material and the seal 6 which is overmolded on the cap 5 is made of thermoplastic elastomer. The seal is made, for example, from a thermoplastic material having a hardness of between 30 and 80 Shore A, preferably equal to 50 Shore A.

According to another advantage, the cap 5 is outside the casing formed by the chassis and the cover; it is not at risk of igniting. Lastly, since the cap 5 is made from a rigid plastics material, it allows repeatable handling, allowing the assembly of the electronic box to be automated.

FIGS. 2A-2E illustrate the configuration of the cap 5 in more detail in different views.

According to one embodiment, the cap 5 comprises an upper arm 51 and a lower arm 52 that are connected together by a transverse arm 53 so as to form a U-shaped housing 56. When the cap is positioned on the electronic board, the antenna region 9 is received in the housing 56. In other words, the upper arm 51 covers a face of the electronic board that is provided with the antenna region and oriented toward the chassis 2, and the lower arm 52 covers a face of the electronic board that is oriented toward the cover 3. Lastly, the transverse arm 53 covers an edge face of the electronic board 4.

The cap is mounted on the electronic board by engaging it with the latter in the direction of the arrows F in FIGS. 1 and 3. The width (L) of the housing is much greater than the thickness of the electronic board to make mounting easier.

Advantageously, and as illustrated in FIG. 1, the chassis 2 comprises a first retaining tab 21 positioned in the first opening 7 and the cover 3 comprises a second retaining tab 31 positioned in the second opening 8. The two retaining tabs 21, 31 extend parallel to the positioning direction (F) of the cap from an edge of the opening which is perpendicular to the positioning direction (F) of the cap. Thus, when the cover 3 and the chassis 2 are mounted on the electronic board 4, the first retaining tab 21 bears against a face of the upper arm 51 of the cap 5 and the second retaining tab 31 bears against a face of the lower arm 52 of the cap 5. Thus, the existence of these two tabs makes it possible to improve the retention of the cap in position on the electronic board and to limit the stress in this board during handling. When the cover and chassis are made of metal, the tabs 21 and 31 allow electromagnetic separation of the antennas.

It is apparent from FIG. 1 that the first and second retaining tabs 21, 31 are positioned substantially at the center of the first and second openings. The cap 5 also comprises an upper groove 57 in the upper arm 51 and a lower groove 57 in the lower arm 52. The two grooves are U-shaped and extend parallel to the positioning direction (F) of the cap. They are positioned substantially at the center of the two arms and positioned opposite one another. Thus, when the cap 5 is positioned on the electronic board 4, and when the cover 3 and the chassis 2 are mounted on the electronic board 4, the first and second retaining tabs 21, 31 bear against the free edges of the two grooves, covering the two grooves as illustrated in FIG. 5C.

It is apparent from FIG. 2C that the overmolded seal 6 comprises a first seal strip 61 which extends continuously along the free edge of the upper arm.

It is apparent from FIG. 2D that the overmolded seal 6 comprises a second seal strip 62 which extends continuously along the free edge of the lower arm. Advantageously, the second seal strip 62 extends continuously along the free edge of the lower arm and along the ridge between the lower arm 52 and the transverse arm 53.

Thus, when the cover and the chassis are mounted on the electronic board, the first seal strip 61 is compressed against the edge of the first opening 7 and the first retaining tab 21, and the second seal strip 62 is compressed against the edge of the second opening 8 and the second retaining tab 31. The existence of these seal strips makes it possible to seal the electronic box.

It will be noted that having a seal along the ridge between the lower arm 52 and the transverse arm 53 makes it possible to prevent liquid from passing into the gap between the transverse arm and the internal face of the cover. It is apparent from FIG. 4 that when the cover and the chassis are mounted on the electronic board, the seal strip 61 of the upper arm is compressed against the chassis and the first extension tab, and the second seal strip 62 of the lower arm is compressed against the cover and the second extension tab. The seal strips thus form a protective barrier to prevent the penetration of liquid into the openings formed in the cover and the chassis. It is apparent from FIG. 4 that drops of water that fall on the box naturally follow a flow path indicated by an arrow along the external faces of the cap and are prevented from passing into the U-shaped housing in which the antenna region is located.

Advantageously, and as illustrated in FIG. 3, each seal strip comprises two extensions 64, 65 which extend in the continuation of the transverse arm 53, on either side of the transverse arm. The electronic board comprises two corresponding recesses 47, 48 in which the extensions 64, 65 are accommodated when the cap is engaged with the electronic board. The existence of these two extensions helps to seal the electronic box.

Advantageously, the thermoplastic material selected to produce the overmolded seal is preferably chosen in a color that contrasts with that of the rigid material chosen to produce the cap. This solution makes it easier to check the integrity of the assembly by way of a visual inspection.

Advantageously, the thermoplastic material is selected according to the following additional criteria:

having chemical adhesion compatible with the material of the cap;

having a dielectric property and wave absorption that are compatible with the range of operating frequencies of the antennas of the electronic box, typically that of the Bluetooth, wifi and GPS functions but also of the AM and FM bands;

having good thermal stability, typically at temperatures from −40 to 105° C.

According to one particularly advantageous embodiment, the cap is provided with elements that make it easier to mount the cap on the electronic board and improve the retention of the cap on the electronic board.

In the example illustrated in FIG. 2E and FIG. 3, the cap 5 comprises two clip-fastening protrusions 54, 55 formed on an internal face of the upper arm 5, and the board 4 comprises two associated holes 41, 42 formed close to the antenna region 9. Each protrusion is intended to be inserted into a corresponding hole when the cap 5 is positioned on the electronic board 4. This combination of the protrusion and the hole makes it possible to retain the cap on the electronic board during assembly. It will be noted that the use of clip-fastening protrusions makes it possible to easily remove the cap compared with the use of screw-fastening means.

According to the exemplary embodiment illustrated in FIG. 2E, the clip-fastening protrusions 55, 54 are formed close to the free edge of the internal face of the upper arm, on the opposite side from the transverse arm.

Advantageously, it will be noted that the protrusion is in the form of a truncated cone (visible in FIG. 2B), the edges of which form inclined ramp surfaces. Thus, when the cap is being engaged with the electronic board, the protrusions can be inserted easily into the associated holes without exerting pressure on the electronic board.

Advantageously, the cap 5 also comprises a centering rib 59 formed on an internal face of the upper arm 5, and the board 4 comprises an associated centering slot 43 formed at the edge of the antenna region 9. The centering slot 43 is intended to receive the centering rib 59 when the cap is engaged with the electronic board, thereby helping to center the board with respect to the antenna region.

According to the exemplary embodiment illustrated in FIG. 2E, the centering rib 59 and the slot 43 have an elongate shape oriented in the positioning direction (F) of the cap on the electronic board.

Advantageously, the centering rib 59 is not disposed in the plane of symmetry of the cap 5 so as to provide an orienting poka-yoke while the cap is being positioned on the electronic board.

As illustrated in FIG. 3, it will be noted that the slot 43 has a somewhat narrow opening 44 for locally managing play with the centering rib 59, and it flares outward at its end, as indicated at 45, to allow easy insertion of the centering rib 59 into the slot 43.

As illustrated in FIG. 2E, the cap 5 also comprises two stop elements 60 formed on an internal face of the upper arm. These stop elements act as a bearing surface when the cap is mounted on the electronic board. Thus, when the cap is positioned on the board, an edge of the electronic board bears against the stop elements. The stop elements have the function of indicating the stopping of engagement of the cap with the electronic board in order to avoid any risk of pressure being applied to the board during assembly.

With reference to FIGS. 5A-5C, the method for assembling the electronic box 1 is described below and comprises the following steps.

The chassis 2, the cover 3, the electronic board 4 provided with the antenna region 9, and the cap 5 having the seal 6 overmolded directly on the external surfaces of the cap are provided.

The cap 5 is centered with respect to the antenna region 9 by virtue of the combination of the centering rib 59 and the centering slot 43. The cap 5 is then engaged with the electronic board 4 in the direction of the arrow F. During this movement, the arms of the cap 5 are spaced apart slightly by the edge of the electronic board on account of the slightly rounded shape of the ends of the arms, and the protrusions 54, 55 are then inserted into the associated holes 41, 42 in the electronic board 4 in order to retain the cap 5 on the electronic board 4.

The antenna region 9 is thus protected by the upper arm and the lower arm of the cap as illustrated in FIG. 5B.

The chassis 2 is placed against one face of the electronic board 4 and the cover 3 against an opposite face of the electronic board such that the antenna region 9 is next to the opening 7 in the chassis and the opposite face of the antenna region is next to the opening 8 in the cover.

The cover 3 is fastened to the electronic board 4 by fastening screws 13.

The cover 3 is fastened to the chassis 2 by fastening screws 13.

The different steps can be carried out in the order described here or, for some, in a different order. Similarly, the steps can be carried out sequentially or, for some, simultaneously.

According to another exemplary embodiment, the steps of fastening the cover to the electronic board and fastening the cover to the chassis can be carried out simultaneously.

It will be noted that, since the seal 6 is overmolded directly on the cap, the number of steps is reduced by eliminating the step of depositing the seal, and therefore the costs associated with the production and the assembly of the electronic box are reduced.

The solution of the present disclosure makes it possible to remedy problems of sealing electronic boxes, the chassis and cover of which are made of metal material and which have antennas.

The electronic box of an aspect of the present invention has the following technical advantages:

The electronic box is able to be disassembled by virtue of the existence of the seal overmolded on the cap, thereby making it possible to repair the box and to recycle the elements of the box.

The antennas remain on the main electronic board; it is not necessary to move the antennas outside the main electronic board. The solution of an aspect of the present invention thus makes it possible to reduce the production costs.

It is no longer necessary to implement seal deposition methods, thereby making it possible to reduce the machine cost and the production time.

By virtue of the architecture of the cap, it is possible to implement a shielding bulkhead 16 at the chassis and the cover by surrounding the antenna region as illustrated in FIG. 6, thereby making it possible to separate the antennas from the rest of the electronic board. The antennas are therefore no longer disrupted by the other electromagnetic sources of the electronic board.

INDUSTRIAL APPLICATION

The electronic box according to an aspect of the invention is particularly suitable for equipping devices connected to a motor vehicle. It may also equip all of the connected products that are provided with internal antennas accommodated in a box having a metal casing.

The invention claimed is:

1. A sealed electronic antenna box comprising:

a rigid chassis having a first opening positioned at one of the edges of the chassis;

a rigid cover having a second opening positioned at one of the edges of the cover;

an electronic board having an antenna region arranged close to one edge of the electronic board, the board being mounted in the box such that an upper face of the antenna region is oriented so as to face the first opening in the chassis and a lower face of the antenna region is oriented so as to face the second opening in the cover;

a cap configured to engage with an edge of the electronic board so as to cover the antenna region and the first and second openings;

a seal overmolded on an external surface of the cap, extending along the free edges of the cap such that when the cover and the chassis are mounted on the electronic board, the seal is compressed against a surface of the chassis and of the cover in order to close the two openings in a sealed manner.

2. The box as claimed in claim 1, wherein the cap comprises an upper arm and a lower arm that are connected together by a transverse arm so as to form a U-shaped housing in which the antenna region is received, the upper arm covering a face of the antenna region that is oriented toward the chassis and the lower arm covering a face of the antenna region that is oriented toward the cover, and the transverse arm covering an edge face of the electronic board.

3. The box as claimed in claim 2, wherein the overmolded seal comprises a first seal strip which extends continuously along the free edge of the upper arm, and a second seal strip which extends continuously along the free edge of the lower arm and along the ridge between the lower arm and the transverse arm.

4. The box as claimed in claim 2, wherein the cap comprises at least one protrusion formed on an internal face of the upper arm, and the electronic board comprises at least one associated hole which is intended to receive said at least one protrusion in order to retain the cap on the board.

5. The box as claimed in claim 2, wherein the cap comprises a centering rib formed on an internal face of the upper arm, and the electronic board comprises an associated centering slot which is intended to receive the centering rib.

6. The box as claimed in claim 5, wherein the centering rib is not disposed in the plane of symmetry of the cap so as to provide an orienting poka-yoke while the cap is being positioned on the electronic board.

7. The box as claimed in claim 2, wherein the cap comprises at least one stop element formed on an internal face of the upper arm, an edge of the electronic board bearing against the stop element when the cap is positioned on the electronic board.

8. The box as claimed in claim 1, wherein the chassis comprises a first retaining tab positioned in the first opening and the cover comprises a second retaining tab positioned in the second opening, the retaining tabs extending parallel to the positioning direction of the cap from an edge of the opening that is perpendicular to the positioning direction of the cap, and the cap comprises an associated groove which is configured such that when the cover and the chassis are mounted on the electronic board, the first and second retaining tabs bear against a portion of the overmolded seal extending along the groove.

9. The box as claimed in claim 1, wherein the cap is made of rigid plastics material and the seal is made of thermoplastic elastomer.

10. The box as claimed in claim 3, wherein the cap comprises at least one protrusion formed on an internal face of the upper arm, and the electronic board comprises at least one associated hole which is intended to receive said at least one protrusion in order to retain the cap on the board.

\* \* \* \* \*